US006846690B2

(12) United States Patent
Farcy et al.

(10) Patent No.: US 6,846,690 B2
(45) Date of Patent: Jan. 25, 2005

(54) INTEGRATED CIRCUIT COMPRISING AN AUXILIARY COMPONENT, FOR EXAMPLE A PASSIVE COMPONENT OR A MICROELECTROMECHANICAL SYSTEM, PLACED ABOVE AN ELECTRONIC CHIP, AND THE CORRESPONDING FABRICATION PROCESS

(75) Inventors: Alexis Farcy, La Ravoire (FR); Philippe Coronel, Barraux (FR); Pascal Ancey, Revel (FR); Joaquin Torres, St. Martin le Vinoux (FR)

(73) Assignee: STMicroelectronics S.A., Montrouge (FR)

( * ) Notice: Subject to any disclaimer, the term of this patent is extended or adjusted under 35 U.S.C. 154(b) by 26 days.

(21) Appl. No.: 10/308,482

(22) Filed: Dec. 3, 2002

(65) Prior Publication Data

US 2003/0119219 A1 Jun. 26, 2003

(30) Foreign Application Priority Data

Dec. 3, 2001  (FR) .......................................... 01 15594

(51) Int. Cl.[7] .......................... H01L 21/00; H01L 21/30
(52) U.S. Cl. ............................ 438/48; 438/51; 438/455
(58) Field of Search .............................. 438/48, 51, 455

(56) References Cited

U.S. PATENT DOCUMENTS 4,773,972 A    9/1988    Mikkor

FOREIGN PATENT DOCUMENTS

| DE | 100 27 234 | 12/2000 |
|---|---|---|
| EP | 0772045 | * 7/1995 |
| EP | 0 772 045 | 5/1997 |
| EP | 1 079 431 | 2/2001 |
| EP | 1 096 259 | 5/2001 |
| WO | WO 01/29529 | 4/2001 |

OTHER PUBLICATIONS

French Preliminary Search Report dated Jul. 16, 2002 for French Application No. 0115594.

* cited by examiner

Primary Examiner—Alexander Ghyka
(74) Attorney, Agent, or Firm—Lisa K. Jorgenson; Jose Gutman; Fleit, Kain, Gibbons, Gutman, Bongini & Bianco P.L.

(57) ABSTRACT

The fabrication of an integrated circuit includes a first phase of producing an electronic chip and a second phase of producing at least one auxiliary component placed above the chip and of producing a protective cover which covers the auxiliary component. The first phase of producing the chip is effected from a first semiconductor substrate and comprises the formation of a cavity lying in a chosen region of the chip and emerging at the upper surface of the chip. The second production phase includes the production of the auxiliary component from a second semiconductor substrate, separate from the first, and then the placement in the cavity of the auxiliary component supported by the second substrate and the mutual adhesion of the second substrate to the upper surface of the chip lying outside the cavity. The second substrate then also forms the protective cover.

15 Claims, 4 Drawing Sheets

FIG.3a
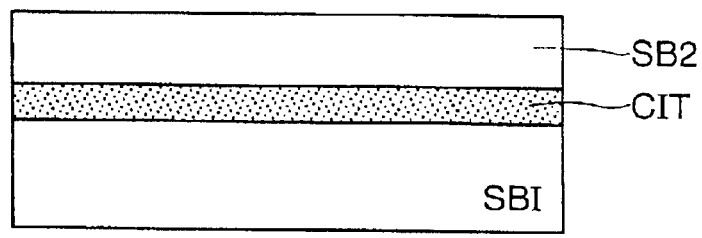
FIG.3b
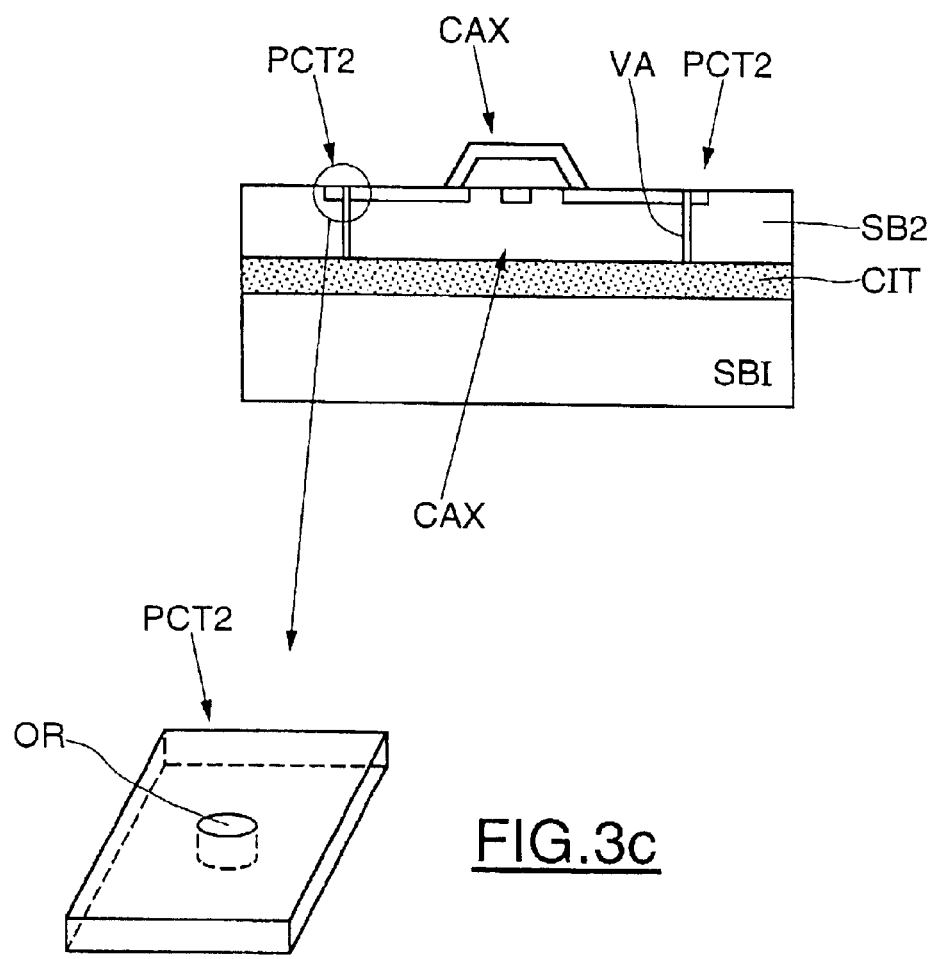
FIG.3c

INTEGRATED CIRCUIT COMPRISING AN AUXILIARY COMPONENT, FOR EXAMPLE A PASSIVE COMPONENT OR A MICROELECTROMECHANICAL SYSTEM, PLACED ABOVE AN ELECTRONIC CHIP, AND THE CORRESPONDING FABRICATION PROCESS

CROSS-REFERENCE TO RELATED APPLICATION

This application is based upon and claims priority from prior French Patent Application No. 01 15594, filed on Dec. 3, 2001, the entire disclosure of which is herein incorporated by reference.

BACKGROUND OF THE INVENTION

1. Field of the Invention

The invention relates to integrated circuits and more particularly to the incorporation of auxiliary components, such as high-performance passive components or microelectromechanical systems, on an electronic chip.

2. Description of the Related Art

The development of microelectronic technologies has been accompanied by an increasingly systematic integration of complex electrical functions, hitherto located outside the package of the integrated circuit. Among these functions, mention may be made of microelectromechanical systems (MEMS) and passive components known to those skilled in the art as above-IC components produced above the passivation layer covering the integrated circuit.

The production of these MEMS systems or passive components requires strict compatibility, especially thermal compatibility, of their steps with those of the production of the lower interconnect levels, and a protective layer before the circuit is packaged.

At the present time, the incorporation of high-performance passive components and microelectromechanical systems is divided into two steps, namely the incorporation of the component on the one hand and the assembly with a protective cover on the other.

The production of the component takes place directly on the chip where the digital and analogue circuits are integrated, above an insulating passivation layer.

The protective cover is produced by means of an additional layer placed above the component, this additional layer having to allow it to be mechanically isolated from the external world without thereby degrading performance or preventing its movement, especially in the case of microelectromechanical systems. In addition, strict compatibility between the "chip/component/protective cover" stack and the standard packaging processes proves to be necessary, in particular in the case of electrical connection of the chip to the package. At the present time, processes are known which ensure one or other of these functions.

By way of indication, mention may be made of the process known to those skilled in the art by the name "flip-chip". This process involves contacts which ensure the mechanical integrity of the stack and the electrical connection between the chip and the lower face of the cover. More specifically, a wafer, aligned with respect to the passivation layer on which the component has been produced, is bonded by partial fusion at a moderate temperature with the aid of solder bumps which then serve as support. This flip-chip procedure damages neither the interconnects nor the component to be covered. However, the discrete nature of the solder bumps does not protect the side walls of the component, for example a microswitch.

According to a second approach, again after having produced the component on the passivation layer covering the integrated circuit, the component is covered with a wafer in which a cavity intended to receive the component has been made. This wafer is fixed to the passivation layer of the integrated circuit with the aid of a polymer material which acts as adhesive. Mechanical isolation is complete. On the other hand, the two wafers remain electrically isolated and only localized etching of the cover above the contact pads will allow contact with the lower circuit by means of additional steps during packaging.

Thus, in the prior art, no method allows both the component to be protected and the electrical contacting, indispensable for packaging, to be guaranteed.

Added to this limitation are further drawbacks which are associated with the contemplated approach and which complicate the integration.

This is because the component is produced above the electronic chip. To avoid any damage to the lower interconnect levels, this production must not involve temperatures above 450° C. However, this constraint in particular prevents the use of specific materials, such as certain dielectrics having a very high permittivity.

Moreover, the processes of the prior art finally end up with a stack substantially greater than 500 microns in height, which no longer allows the standard packaging procedures to be applied. It is then necessary to thin the cover, but its handling then becomes a tricky operation because of its mechanical fragility.

Moreover, once the wafers have been assembled, it becomes difficult to perform further technological operations because of the non-uniformity of the thickness of the adhesive polymer and of the solder bumps which mean that the upper surface has a poor flatness.

Accordingly, there exists a need for overcoming the disadvantages of the prior art as discussed above.

SUMMARY OF THE INVENTION

The invention aims to provide a solution to these problems.

One object of the invention is to provide an assembly which has an almost perfectly plane upper surface allowing further technological steps to be carried out.

The object of the invention is also to make the production of an "electronic chip/component" assembly compatible with standard packaging processes.

The object of the invention is also to ensure at the same time electrical connection of the component to the chip and its mechanical encapsulation.

The invention therefore provides a process for fabricating an integrated circuit, comprising a phase of producing an electronic chip and a phase of producing at least one auxiliary component (for example a passive component or else a MEMS-type component) placed above the chip and of producing a protective cover which covers the auxiliary component.

According to a general feature of the invention, the chip is produced from a first semiconductor substrate, whereas the auxiliary component is produced from a second semiconductor substrate, separate from the first. The second substrate supporting the auxiliary component is made to adhere mutually to the first semiconductor substrate in an adhesion region lying outside a cavity containing the auxiliary component and extending into one or other of the two substrates or into both substrates, the second substrate then also forming the protective cover.

In other words, according to the invention, the chip on a standard semiconductor wafer and the auxiliary component on another specific wafer are produced independently. Thus, there is no risk of the processes involving the auxiliary component damaging the chip interconnects.

Moreover, the use of a virgin wafer as support for producing the auxiliary component greatly widens the choice of material processes, independently of the constraints associated with the interconnects.

The cavity may be produced only in the chip from it's front face, or else only in the wafer used to produce the auxiliary component. The cavity may also be formed from two cavity portions formed facing each other in the chip and in the wafer, respectively.

Thus, according to a first implementational variant, the phase of producing the chip comprises the formation of the cavity lying in a chosen region of the chip and emerging at the upper surface (i.e. the front face) of the chip, and the phase of producing the auxiliary component and the protective cover comprises the placement, in the cavity, of the auxiliary component supported by the second substrate and the mutual adhesion of the second substrate to the upper surface of the chip lying outside the cavity, the second substrate then also forming the protective cover.

According to a second implementational variant, the phase of producing the auxiliary component and the cover comprises the formation of the cavity in the second substrate and the production of the auxiliary component in the cavity, and then the mutual adhesion of the second substrate to the upper surface of the chip lying outside the cavity, the second substrate then also forming the protective cover.

According to a third implementational variant, the phase of producing the chip comprises the formation of a first cavity portion lying in a chosen region of the chip and emerging at the upper surface of the chip. The phase of producing the auxiliary component and the cover comprises the formation of a second cavity portion in the second substrate and the production of the auxiliary component in the second cavity portion, and then the mutual adhesion of the second substrate to the upper surface of the chip lying outside the cavity which is then formed by the two cavity portions, the second substrate then also forming the protective cover.

According to a method of implementing the process compatible with the three abovementioned variants, the production of the auxiliary component comprises:

the formation on an initial substrate, for example a silicon substrate, of an intermediate layer composed of at least one sublayer of a material that can be selectively removed with respect to the material forming the second substrate and with respect to the material forming the initial substrate;

the formation of the second substrate on the intermediate layer; and the formation of the auxiliary component on the second substrate, this auxiliary component projecting from the upper surface of the second substrate (it being possible, depending on the implementational variant, for this upper surface to be plane or recessed in order to provide a cavity or a cavity portion).

Moreover, the production of the protective cover comprises, after the upper surface of the chip lying outside the cavity has adhered to the corresponding facing portion of the surface of the second substrate, the removal of the sublayer and of the initial substrate.

The use of a buried layer (intermediate layer) allows fine control of the thickness of the layer which will cover the electronic chip, that is to say the thickness of the second substrate. Etching of the vias (interconnect holes) is thereby considerably facilitated and the thickness of the whole assembly remains compatible with the standard packaging processes. In addition, this process permits, as final passivation, a wide choice of materials compatible with the radiofrequency performance required, should this be necessary.

When the intermediate layer is entirely formed from the removable material, it is completely removed. However, as a variant, the intermediate layer may be formed from a stack of several sublayers, some but not all of which are composed of a material that can be selectively removed with respect to the material forming the second substrate and with respect to the material forming the initial substrate. In this case after the adhesion step, all the removable sublayers and the initial substrate are removed.

In this variant, there then remain sublayers, which may be made of silicon, for example, on which further transistors or other active components may, for example, be produced.

According to one method of implementing the invention, the production of the electronic chip comprises the production of first contact pads emerging at the upper surface of the chip within the adhesion region. The production of the auxiliary component comprises the production of second contact pads within the adhesion region (at the periphery of the auxiliary component). During mutual adhesion, the second contact pads come into contact with the first contact pads.

Thus, if the first and second contact pads are made of metal and at least one of the first contact pads is connected to the chip, while at least one of the second contact pads is connected to the auxiliary component, electrical connection and mechanical connection between the chip and the auxiliary component are made at the time.

Moreover it is particularly advantageous that the production of each second contact pad comprises the formation of an orifice passing through the pad. Thus, after a second pad has been brought into contact with a corresponding first pad, a rivet is made by metallization in the orifice of the second pad. In other words, metallization of the vias which pass through the protective cover electrically connect the two wafers and improve the mechanical strength of the assembly by generating microscopic rivets. The latter may be distributed where the designer chooses, at key points on the chip so as to optimize the mechanical integrity of the whole assembly.

Although various options are provided for carrying out the step of mutual adhesion of the two substrates, such as for example the use of a polymer material, it is particularly advantageous for this adhesion to be carried out by low-temperature molecular bonding. This prevents any circuit from being damaged. Moreover, molecular bonding preserves the option of carrying out both the electrical connection and the mechanical connection, whereas if an adhesion technique using a polymer material between the contact pads is employed, it is necessary to provide an electrical connection at a point other than at the contact pads.

The subject of the invention is also an integrated circuit comprising an electronic chip, at least one auxiliary component placed above the chip and a protective cover which covers the auxiliary component.

According to a general feature of the invention, the auxiliary component projects from the lower face of a semiconductor substrate and extends into a cavity made in the chip or in the semiconductor substrate or in both. The substrate also forms the protective cover. The lower face of the substrate is fixed to that portion of the upper surface of the chip lying outside the cavity and the upper face of the substrate supporting the auxiliary component is approximately plane.

According to a first embodiment variant, the lower surface of the semiconductor substrate is plane and the upper surface of the chip has a shape which provides the cavity in a chosen region of the chip.

According to a second embodiment variant, the upper surface of the chip is plane and the lower surface of the semiconductor substrate has a shape which provides the cavity in this semiconductor substrate.

According to a third embodiment variant, the lower surface of the semiconductor substrate has a shape which provides a first cavity portion in this semiconductor substrate, and the upper surface of the chip has a shape which provides a second cavity portion in a chosen region of the chip. The cavity is then formed from the two cavity portions facing each other.

According to an embodiment of the invention compatible with these three embodiment variants, the electronic chip includes first contact pads emerging at the upper surface of the chip outside the cavity. The auxiliary component for its part includes second contact pads lying on the periphery of the auxiliary component. The second contact pads are in contact with the first contact pads.

The integrated circuit advantageously includes rivets fastening each second contact pad to the corresponding first pad.

BRIEF DESCRIPTION OF THE DRAWINGS

Further advantages and features of the invention will become apparent on reading the detailed description of entirely non-limiting embodiments and methods of implementation, and the appended drawings in which:

FIGS. 3a to 3c illustrate in greater detail, but again schematically, certain steps in a method of implementing the process resulting in the production of an auxiliary component;

DESCRIPTION OF THE PREFERRED EMBODIMENTS

Figure 1:
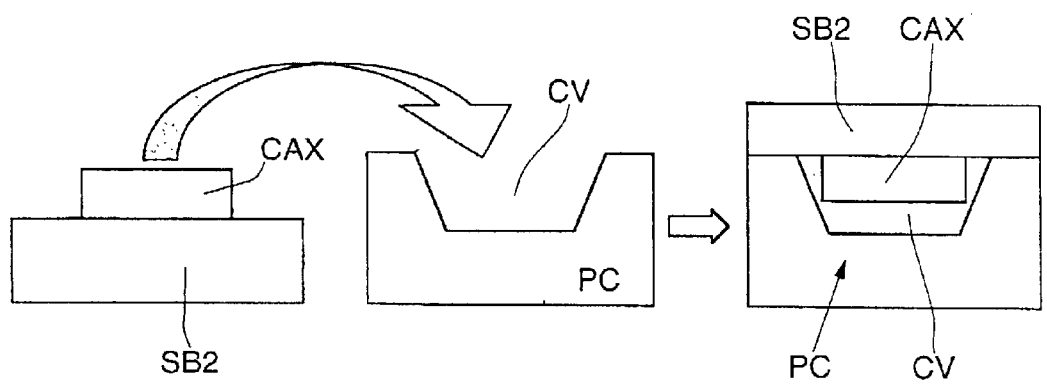
FIG. 1 illustrates in a very general and highly schematic manner, a first method of implementing the process according to the invention, making it possible to end up with a first embodiment of an integrated circuit according to the invention.

In the left-hand part of FIG. 1, the reference SB2 denotes a semiconductor substrate on which an auxiliary component CAX, for example a passive component, or else a microelectromechanical system, has been produced.

Moreover, on a substrate separate from the substrate SB2, in a conventional manner known per se, an electronic chip PC is produced and a cavity CV intended to house the component CAX is provided, at a chosen point, in the upper portion of this electronic chip PC.

Next, as illustrated in the right-hand part of FIG. 1, the upper face (which has become the lower face in the right-hand part of FIG. 1) of the substrate SB2 is fastened to that part of the upper face of the electronic chip lying outside the cavity CV.

An integrated circuit is then obtained which, after packaging, comprises an assembly consisting of an electronic chip PC and an auxiliary component CAX, the upper surface of which assembly is approximately plane.

This method of implementing the invention will now be explained in greater detail with reference to the following figures.

Figure 2A:
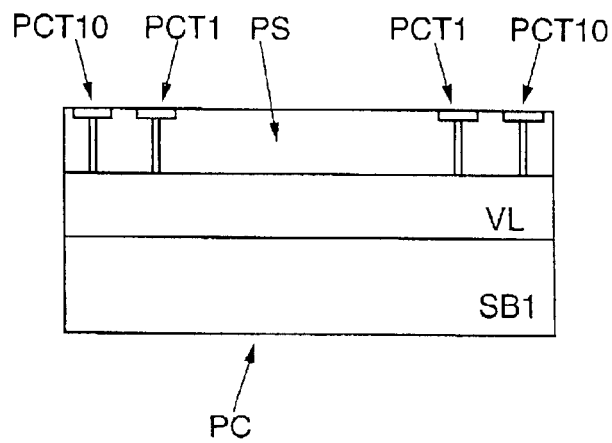
FIGS. 2a and 2b illustrate in greater detail, but again schematically, steps in a method of implementing the process, leading to the furnishing of the electronic chip.

In FIG. 2a, the electronic chip PC is produced in a conventional manner known per se from a silicon substrate SB1, above which a certain number of interconnect levels VL are provided. The whole assembly is covered with an insulating passivation layer PS, for example formed from silicon dioxide. Metal tracks and contact pads, PCT1, PCT10, produced in a conventional manner known per se, emerge at the surface of the passivation layer and allow interconnections with components of the electronic chip located in the silicon substrate, by means of various interconnect levels.

Figure 2B:
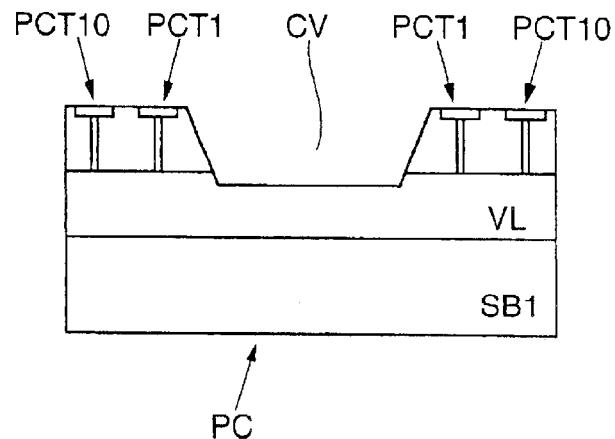

Moreover, a cavity CV, which is intended to house the auxiliary component CAX, is provided in a chosen region of the electronic chip. This cavity CV (FIG. 2b) lies in a region which is, for example, stripped of metal and which, in any case, will not interfere with the structure or the operation of the electronic components of the chip. The depth of the cavity depends on the height of the auxiliary component CAX which will be inserted thereinto. Depending on the applications, the cavity may extend only into the passivation layer or else may be etched through the passivation layer, a certain number of interconnect levels VL and possibly right down to the substrate SB1.

Moreover, the auxiliary component CAX shall be produced on a second substrate SB2 (FIG. 3a) which is completely separate from the substrate of the electronic chip PC.

More specifically, in this method of implementation, the substrate SB2, for example made of silicon, is produced from an initial substrate SB1, on which a layer, called "intermediate layer CIT", has been produced. The substrate SB2 rests on this intermediate layer CIT.

The intermediate layer CIT is therefore a buried layer. It is formed from a material which can be removed selectively with respect to the material forming the substrate SB2 and the substrate SB1.

As an example, the assembly formed from the initial substrate SB1, from the buried layer CIT and from the second substrate SB2 may be a silicon-on-insulator substrate (SOI) substrate, the structure and the production of which are well known to those skilled in the art. In this case, the substrate SB2 is, for example, a thin layer of silicon resting on silicon dioxide forming the buried layer CIT.

As a variant, the layer CIT may be formed by epitaxial growth of a silicon-germanium alloy on the initial substrate SB1 formed from silicon. The second, silicon substrate SB2 is then itself grown epitaxially on the layer CIT.

Next, as illustrated in FIG. 3b, an auxiliary component CAX, in this case a microelectromechanical system, is produced in a conventional manner known per se in and on the substrate SB2.

This component CAX includes peripheral extensions forming contact pads PCT2.

Figure 5:
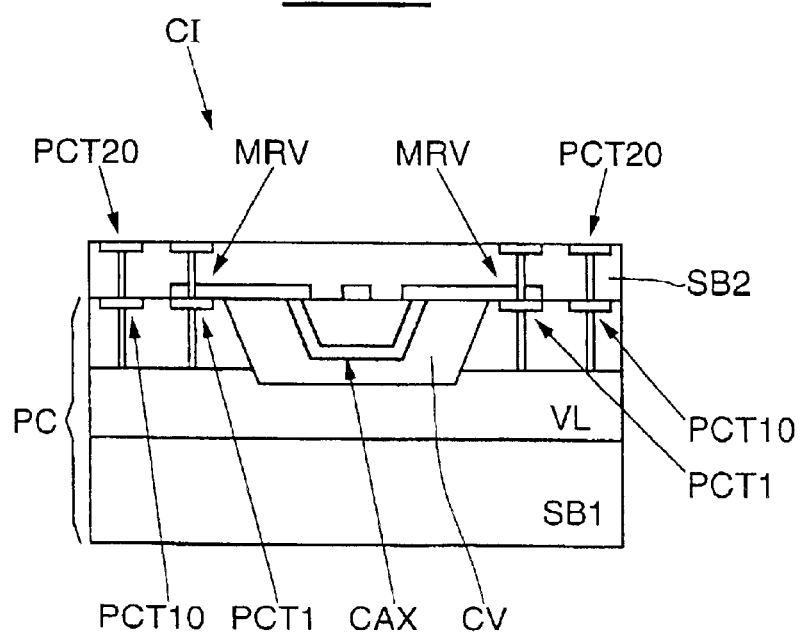

As illustrated in FIG. 3c, each contact pad PCT2 is pierced by a central orifice OR which is extended by a hole or via VA into the substrate SB2 as far as the buried layer CIT. However, as a variant, this central orifice may be etched subsequently, for example at the same time as the cavities PCT20 (FIG. 5), once the adhesion has been effected.

As will be seen in greater detail below, the pads PCT2 which flank the microswitch are intended to connect it electrically and mechanically to the other wafer, that is to say to the electronic chip, on which the control circuits are to be found.

Figure 4:
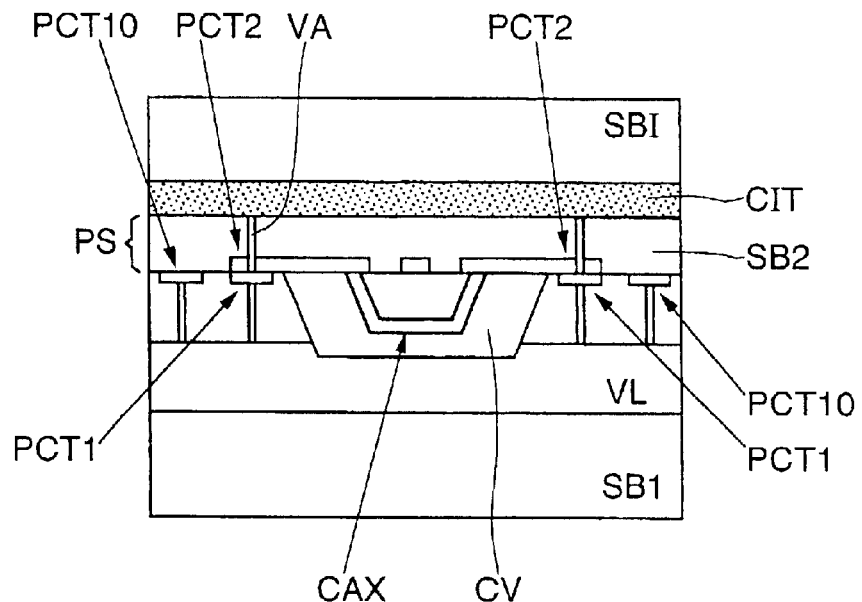
FIGS. 4 and 5 illustrate in greater detail, but again schematically, assembly steps in the process according to the invention, making it possible to end up with an integrated circuit according to the invention.

The next step consists in turning the assembly supporting the auxiliary component CAX upside down and then in aligning this assembly with the electronic chip so that the microswitch CAX fits perfectly into the cavity CV provided for this purpose (FIG. 4).

The contact pads PCT2 then come into contact with the contact pads PCT1 of the electronic chip.

The adhesion of the substrate SB2 to the upper surface of the electronic chip lying outside the cavity CV is preferably effected by low-temperature molecular bonding. Such molecular bonding is well known to a person skilled in the art and he may refer, for example, to the article by M. Bruel, B. Aspar and A. J. Auberton-Hervé "Smart-Cut: a New Silicon-On-Insulator Material Technology Based on Hydrogen Implantation and Wafer Bonding", Japanese Journal of Applied Physics, Vol. 36, pp. 1636–1641, Part I, No. 3B, March 1997.

This molecular bonding has the advantage of not requiring any additional material to effect the adhesion. Moreover, it damages no circuit and thus makes compatible simultaneous electrical connection with mechanical connection effected at the contact pads PCT1 and PCT2.

The material of the buried layer CIT is then selectively removed, for example by selective etching well known to those skilled in the art, the characteristics of which depend on the material used. Removal of this material of the CIT layer also involves removal of the initial substrate SB1, if the latter had not been removed beforehand by another technique, for example by a process well known to those skilled in the art by the name "smart-cut".

There then only remains (FIG. 5) the second substrate SB2 which supports the component CAX and which consequently forms the upper layer of the integrated circuit formed from the "electronic chip PC/auxiliary component CAX" assembly.

Next, the substrate SB2 is etched so as to produce vias and metal tracks and/or contact pads PCT20 which, after metallization, come into contact with the tracks and/or contact pads PCT10. Likewise, surface cavities are produced in the extension of the vias VA, which will form on the surface, after metallization, the metal tracks and/or contact pads. Moreover, at the interface between the substrate SB2 and the passivation layer of the electronic chip, this metallization of the orifices OR will generate microrivets MRV which will improve the mechanical integrity of the assembly.

The integrated circuit thus obtained has an almost perfectly plane upper surface and if necessary it will be possible to produce, on this upper surface, other levels of vias and metal tracks, or of active components, particularly when the intermediate layer is formed from a stack of sublayers, some of which were not selectively removable, since in this case there remains on the upper surface of the substrate SB2 one or more plane sublayers on which these other levels may be produced.

Figure 6:
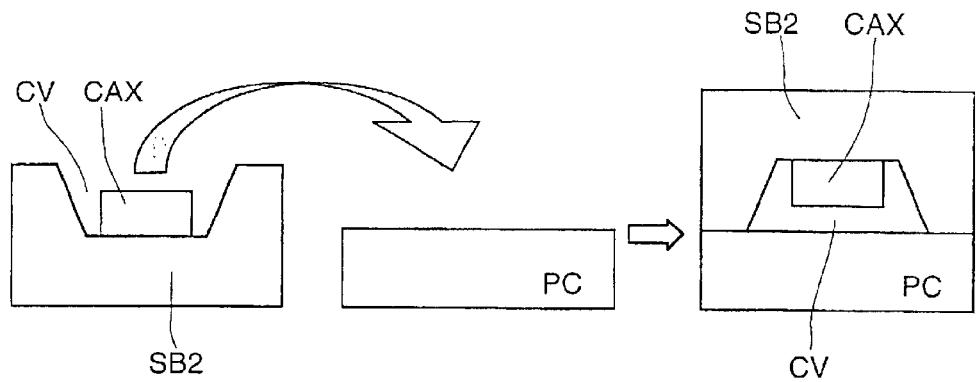
FIGS. 6 and 7 illustrate in a very general and highly schematic manner, two other methods of implementing the process according to the invention, making it possible to end up with two other embodiments of an integrated circuit according to the invention.
Figure 7:
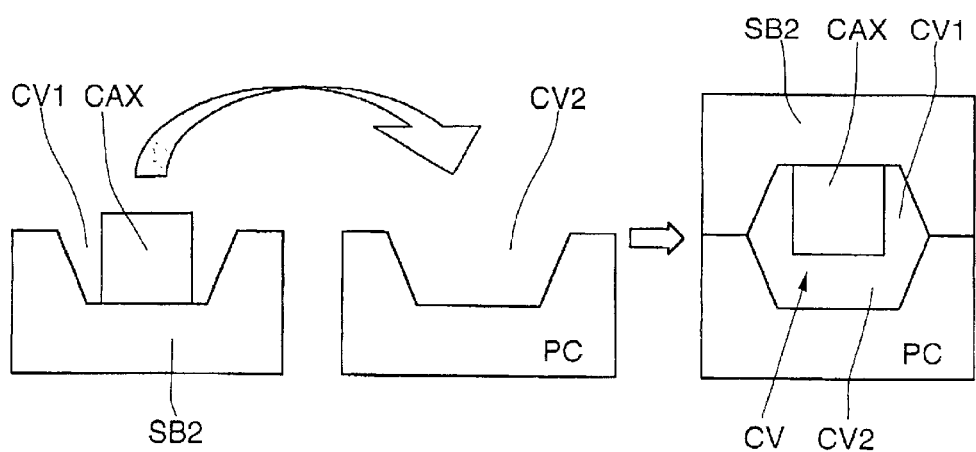

Although in the variant that has just been described the cavity CV was produced just in the substrate SB2, it is possible to produce this cavity just in the chip PC (FIG. 6) or else both in the substrate SB2 and in the chip PC (FIG. 7). The cavity CV is then composed of two cavity portions CV1 and CV2 facing each other.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A process for fabricating an integrated circuit comprising the production of an electronic chip and the production of at least one auxiliary component placed above the chip and of a protective cover which covers the auxiliary component, wherein the chip is produced from a first semiconductor substrate, in that the auxiliary component is produced from a second semiconductor substrate, separate from the first and in that the second substrate supporting the auxiliary component is made to adhere mutually to the first semiconductor substrate in an adhesion region lying outside a cavity containing the auxiliary component and extending into one or other of the two substrates or into both substrates, the second substrate then also forming the protective cover.

2. The process according to claim 1, wherein the phase of producing the chip comprises the formation of the cavity lying in a chosen region of the chip and emerging at the upper surface of the chip and in that the phase of producing the auxiliary component and the protective cover comprises the placement, in the cavity, of the auxiliary component supported by the second substrate and the mutual adhesion of the second substrate to the upper surface of the chip lying outside the cavity, the second substrate then also forming the protective cover.

3. The process according to claim 1, wherein the phase of producing the auxiliary component and the cover comprises the formation of the cavity in the second substrate and the production of the auxiliary component in the cavity, and then the mutual adhesion of the second substrate to the upper surface of the chip lying outside the cavity, the second substrate then also forming the protective cover.

4. The process according to claim 1, wherein the phase of producing the chip comprises the formation of a first cavity portion lying in a chosen region of the chip and emerging at the upper surface of the chip, in that the phase of producing the auxiliary component and the cover comprises the formation of a second cavity portion in the second substrate and the production of the auxiliary component in the second cavity portion, and then the mutual adhesion of the second substrate to the upper surface of the chip lying outside the cavity formed by the two cavity portions, the second substrate then also forming the protective cover.

5. A process for fabricating an integrated circuit comprising the production of an electronic chip and the production of at least one auxiliary component placed above the chip and of a protective cover which covers the auxiliary component, wherein the chip is produced from a first semiconductor substrate, in that the auxiliary component is produced from a second semiconductor substrate, separate from the first and in that the second substrate supporting the auxiliary component is made to adhere mutually to the first semiconductor substrate in an adhesion region lying outside a cavity containing the auxiliary component and extending into one or other of the two substrates or into both substrates, the second substrate then also forming the protective cover, wherein the adhesion step is effected by molecular bonding.

6. A process for fabricating an integrated circuit comprising the production of an electronic chip and the production of at least one auxiliary component placed above the chip and of a protective cover which covers the auxiliary component, wherein the chip is produced from a first semiconductor substrate, in that the auxiliary component is produced from a second semiconductor substrate, separate from the first and in that the second substrate supporting the auxiliary component is made to adhere mutually to the first semiconductor substrate in an adhesion region lying outside a cavity containing the auxiliary component and extending into one or other of the two substrates or into both substrates, the second substrate then also forming the protective cover, wherein the production of the auxiliary component comprises the formation on an initial substrate of an intermediate layer composed of at least one sublayer of a material that can be selectively removed with respect to the material forming the second substrate and with respect to the material forming the initial substrate, the formation of the second substrate on the intermediate layer and the formation of the auxiliary component on the second substrate, this auxiliary component projecting from the upper surface of the second substrate and in that the production of the protective cover comprises, after the upper surface of the chip lying outside the cavity has adhered to the corresponding facing portion of the surface of the second substrate, the removal of the sublayer and of the initial substrate.

7. The process according to claim 6, wherein the intermediate layer is formed from a stack of several sublayers, some but not all of which are composed of a material that can be selectively removed with respect to the material forming the second substrate and with respect to the material forming the initial substrate, and in that, after the adhesion step, all the removable sublayers and the initial substrate are removed.

8. The process according to claim 6, wherein the adhesion step is effected by molecular bonding.

9. A process for fabricating an integrated circuit comprising the production of an electronic chip and the production of at least one auxiliary component placed above the chip and of a protective cover which covers the auxiliary component, wherein the chip is produced from a first semiconductor substrate, in that the auxiliary component is produced from a second semiconductor substrate, separate from the first and in that the second substrate supporting the auxiliary component is made to adhere mutually to the first semiconductor substrate in an adhesion region lying outside a cavity containing the auxiliary component and extending into one or other of the two substrates or into both substrates, the second substrate then also forming the protective cover, wherein the production of the electronic chip comprises the production of first contact pads emerging at the upper surface of the chip inside the adhesion region, in that the production of the auxiliary component comprises the production of second contact pads within the adhesion region and in that, during the mutual adhesion, the second contact pads come into contact with the first contact pads.

10. The process according to claim 9, wherein the first and second contact pads are made of metal, at least one of the first contact pads being connected to the chip while at least one of the second contact pads is connected to the auxiliary component, so as to ensure electrical connection between the chip and the auxiliary component.

11. The process according to claim 10, wherein the formation of the orifice passing through a second contact pad comprises the piercing of the second contact pad and the etching of the second substrate in the extension of the hole in the second contact pad and in that the production of the rivet comprises the metallization of the etched orifice of the second substrate and of the through-orifice of the second connection pad.

12. The process according to claim 9, wherein the production of each second contact pad comprises the formation of an orifice passing through the pad and in that, after a second pad has been brought into contact with a corresponding first pad, a rivet is produced in the orifice of the second pad.

13. The process according to claim 12, wherein the first and second contact pads are made of metal, at least one of the first contact pads being connected to the chip while at least one of the second contact pads is connected to the auxiliary component, so as to ensure electrical connection between the chip and the auxiliary component.

14. The process according to claim 13, wherein the formation of the orifice passing through a second contact pad comprises the piercing of the second contact pad and the etching of the second substrate in the extension of the hole in the second contact pad and in that the production of the rivet comprises the metallization of the etched orifice of the second substrate and of the through-orifice of the second connection pad.

15. The process according to claim 12, wherein the adhesion step is effected by molecular bonding.

* * * * *

(12) EX PARTE REEXAMINATION CERTIFICATE (9889th)
United States Patent
Farcy et al.

(10) Number: US 6,846,690 C1
(45) Certificate Issued: Oct. 21, 2013

(54) INTEGRATED CIRCUIT COMPRISING AN AUXILIARY COMPONENT, FOR EXAMPLE A PASSIVE COMPONENT OR A MICROELECTROMECHANICAL SYSTEM, PLACED ABOVE AN ELECTRONIC CHIP, AND THE CORRESPONDING FABRICATION PROCESS

(75) Inventors: Alexis Farcy, La Ravoire (FR); Philippe Coronel, Barraux (FR); Pascal Ancey, Revel (FR); Joaquin Torres, St. Martin le Vinoux (FR)

(73) Assignee: STMicroelectronics S.A., Montrouge (FR)

Reexamination Request:
No. 90/012,521, Sep. 12, 2012

Reexamination Certificate for:
Patent No.: 6,846,690
Issued: Jan. 25, 2005
Appl. No.: 10/308,482
Filed: Dec. 3, 2002

(30) Foreign Application Priority Data

Dec. 3, 2001 (FR) ...................................... 01 15594

(51) Int. Cl.
*H01L 21/30* (2006.01)
(52) U.S. Cl.
USPC ................................ 438/48; 438/51; 438/455

(58) Field of Classification Search
None
See application file for complete search history.

(56) References Cited

To view the complete listing of prior art documents cited during the proceeding for Reexamination Control Number 90/012,521, please refer to the USPTO's public Patent Application Information Retrieval (PAIR) system under the Display References tab.

*Primary Examiner* — Leonardo Andujar

(57) ABSTRACT

The fabrication of an integrated circuit includes a first phase of producing an electronic chip and a second phase of producing at least one auxiliary component placed above the chip and of producing a protective cover which covers the auxiliary component. The first phase of producing the chip is effected from a first semiconductor substrate and comprises the formation of a cavity lying in a chosen region of the chip and emerging at the upper surface of the chip. The second production phase includes the production of the auxiliary component from a second semiconductor substrate, separate from the first, and then the placement in the cavity of the auxiliary component supported by the second substrate and the mutual adhesion of the second substrate to the upper surface of the chip lying outside the cavity. The second substrate then also forms the protective cover.

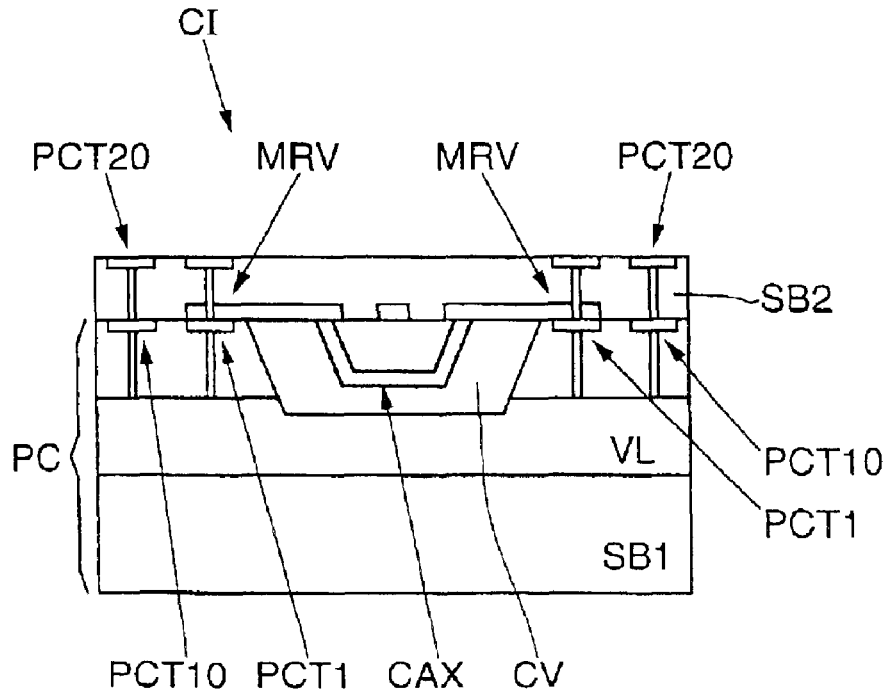

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-15 is confirmed.

New claims 16-18 are added and determined to be patentable.

*16. A process for fabricating an integrated circuit comprising the production of an electronic chip and the production of at least one auxiliary component placed above the chip and of a protective cover which covers the auxiliary component, wherein the chip is produced from a first semiconductor substrate, in that the auxiliary component is produced from a second semiconductor substrate, separate from the first and in that the second substrate supporting the auxiliary component is made to adhere mutually to the first semiconductor substrate in an adhesion region lying outside a cavity containing the auxiliary component and extending into both substrates, the second substrate then also forming the protective cover.*

*17. The process according to claim 16, wherein the adhesion step is effected by molecular bonding.*

*18. The process according to claim 16, wherein the production of the electronic chip comprises the production of first contact pads emerging at the upper surface of the chip inside the adhesion region, in that the production of the auxiliary component comprises the production of second contact pads within the adhesion region and in that, during the mutual adhesion, the second contact pads come into contact with the first contact pads.*

* * * * *